United States Patent
Searls et al.

(10) Patent No.: US 10,251,273 B2
(45) Date of Patent: Apr. 2, 2019

(54) MAINBOARD ASSEMBLY INCLUDING A PACKAGE OVERLYING A DIE DIRECTLY ATTACHED TO THE MAINBOARD

(75) Inventors: Damion Searls, Hillsboro, OR (US); Weston C. Roth, Portland, OR (US); Margaret D. Ramirez, Forest Grove, OR (US); James D. Jackson, Beaverton, OR (US); Rainer E. Thomas, Beaverton, OR (US); Charles A. Gealer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/231,965

(22) Filed: Sep. 8, 2008

(65) Prior Publication Data

US 2010/0061056 A1    Mar. 11, 2010

(51) Int. Cl.
*H05K 7/00* (2006.01)
*H01L 21/56* (2006.01)
(Continued)

(52) U.S. Cl.
CPC ........... *H05K 1/181* (2013.01); *H01L 21/563* (2013.01); *H01L 23/49827* (2013.01); *H01L 25/03* (2013.01); *H01L 23/552* (2013.01); *H01L 24/16* (2013.01); *H01L 24/32* (2013.01); *H01L 24/48* (2013.01); *H01L 24/73* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73203* (2013.01); *H01L 2224/73265* (2013.01); *H01L 2225/06562* (2013.01); *H01L 2924/00011* (2013.01);
(Continued)

(58) Field of Classification Search
CPC ......... H01L 2224/32145; H01L 21/563; H01L 2924/181
USPC ......................................... 257/658, 686, 723
See application file for complete search history.

(56) References Cited

U.S. PATENT DOCUMENTS 5,252,857 A    10/1993    Kane et al.
5,313,366 A    5/1994    Gaudenzi et al.
(Continued)

FOREIGN PATENT DOCUMENTS

JP    03-174760    7/1991
JP    9-260433    10/1997
(Continued)

OTHER PUBLICATIONS

International Search Report and Written Opinion for PCT Patent Application No. PCT/US2009/055133, dated Apr. 1, 2010, 10 pages.
(Continued)

*Primary Examiner* — David C Spalla
(74) *Attorney, Agent, or Firm* — Schwabe, Williamson & Wyatt, P.C.

(57) ABSTRACT

Disclosed are embodiments of a system-level assembly including an integrated circuit (IC) die directly attached to a mainboard. An IC die directly attached to a mainboard or other circuit board may be referred to as a direct-chip attach (DCA) die. A package is disposed over at least a portion of the DCA die and coupled with the mainboard. The package includes one or more other IC die disposed on a substrate. Other embodiments are described and claimed.

12 Claims, 4 Drawing Sheets

(51) Int. Cl.
*H01L 23/48* (2006.01)
*H05K 1/18* (2006.01)
*H01L 23/498* (2006.01)
*H01L 25/03* (2006.01)
*H01L 23/552* (2006.01)
*H01L 23/00* (2006.01)
*H05K 3/28* (2006.01)

(52) U.S. Cl.
CPC ............. *H01L 2924/00014* (2013.01); *H01L 2924/01057* (2013.01); *H01L 2924/09701* (2013.01); *H01L 2924/14* (2013.01); *H01L 2924/1532* (2013.01); *H01L 2924/15192* (2013.01); *H01L 2924/15311* (2013.01); *H01L 2924/19041* (2013.01); *H01L 2924/19042* (2013.01); *H01L 2924/3025* (2013.01); *H05K 3/284* (2013.01); *H05K 2201/10515* (2013.01); *H05K 2201/10674* (2013.01); *H05K 2201/10734* (2013.01); *H05K 2201/10977* (2013.01); *Y02P 70/611* (2015.11)

(56) References Cited

U.S. PATENT DOCUMENTS

| | | | |
|---|---|---|---|
| 5,525,204 | A | 6/1996 | Shurboff et al. |
| 5,543,585 | A | 8/1996 | Booth et al. |
| 5,634,268 | A | 6/1997 | Dalal et al. |
| 5,734,560 | A | 3/1998 | Kamperman et al. |
| 5,747,101 | A | 5/1998 | Booth et al. |
| 5,769,989 | A | 6/1998 | Hoffmeyer et al. |
| 5,773,195 | A | 6/1998 | Kamperman et al. |
| 5,796,591 | A | 8/1998 | Dalal et al. |
| 5,897,336 | A | 4/1999 | Brouillette et al. |
| 5,910,644 | A | 6/1999 | Goodman et al. |
| 5,940,686 | A | 8/1999 | Vasquez |
| 6,098,280 | A | 8/2000 | Kamperman et al. |
| 6,301,121 | B1 | 10/2001 | Lin |
| 6,339,254 | B1* | 1/2002 | Venkateshwaran .......................... H01L 25/0657 257/686 |
| 6,341,418 | B1 | 1/2002 | Brouillette et al. |
| 6,566,612 | B2 | 5/2003 | Brouillette et al. |
| 6,730,860 | B2 | 5/2004 | Searls et al. |
| 6,750,551 | B1 | 6/2004 | Frutschy et al. |
| 6,787,392 | B2 | 9/2004 | Quah |
| 6,835,580 | B1 | 12/2004 | Knapp et al. |
| 6,845,664 | B1 | 1/2005 | Okojie et al. |
| 6,900,534 | B2 | 5/2005 | Murtuza |
| 7,098,051 | B2 | 8/2006 | Quah |
| 7,144,538 | B2 | 12/2006 | Lee et al. |
| 7,233,321 | B1* | 6/2007 | Larson et al. ............... 345/179 |
| 7,306,973 | B2* | 12/2007 | Karnezos ..................... 438/109 |
| 7,317,256 | B2 | 1/2008 | Williams et al. |
| 7,445,962 | B2* | 11/2008 | Choi et al. .................... 438/109 |
| 7,796,400 | B2* | 9/2010 | Kledzik ............. H01L 25/0652 174/260 |
| 7,830,000 | B2* | 11/2010 | Eichelberger et al. ....... 257/706 |
| 7,851,900 | B2* | 12/2010 | Ohsaka et al. ............... 257/686 |
| 2002/0094602 | A1 | 7/2002 | Her et al. |
| 2002/0119605 | A1 | 8/2002 | Lunceford |
| 2003/0166313 | A1 | 9/2003 | Nishikawa et al. |
| 2004/0075164 | A1* | 4/2004 | Pu ...................... H01L 23/3128 257/686 |
| 2004/0135243 | A1 | 7/2004 | Aoyagi |
| 2004/0145039 | A1 | 7/2004 | Shim et al. |
| 2004/0145054 | A1 | 7/2004 | Bang et al. |
| 2004/0262811 | A1 | 12/2004 | Lee et al. |
| 2005/0263869 | A1 | 12/2005 | Tanaka et al. |
| 2006/0197209 | A1* | 9/2006 | Choi et al. .................... 257/686 |
| 2006/0208348 | A1* | 9/2006 | Ohsaka et al. ............... 257/685 |
| 2006/0211461 | A1 | 9/2006 | Hattis |
| 2006/0254809 | A1 | 11/2006 | Kledzik et al. |
| 2006/0289972 | A1* | 12/2006 | Nishimura ............ H01L 21/563 257/666 |
| 2007/0187826 | A1 | 8/2007 | Shim, II et al. |
| 2007/0235864 | A1* | 10/2007 | Megahed ..................... 257/723 |
| 2008/0042274 | A1* | 2/2008 | Bang ................. H01L 23/49816 257/737 |
| 2008/0105964 | A1 | 5/2008 | Iwamura et al. |
| 2009/0236718 | A1* | 9/2009 | Yang ..................... H01L 25/105 257/686 |
| 2009/0320281 | A1* | 12/2009 | Arana ................... H01L 21/563 29/842 |

FOREIGN PATENT DOCUMENTS

| | | |
|---|---|---|
| JP | 2001-207031 | 7/2001 |
| JP | 2002-204053 A | 7/2002 |
| JP | 2004-179232 | 6/2004 |
| JP | 2005-340389 | 12/2005 |
| JP | 2006-013555 A | 1/2006 |
| JP | 2006-040870 A | 2/2006 |
| JP | 2006-186391 A | 7/2006 |
| JP | 2006-295136 A | 10/2006 |
| JP | 2007-266640 | 10/2007 |
| JP | 2008-124080 | 5/2008 |
| JP | 2008-514004 | 5/2008 |
| TW | 200807589 A | 3/1996 |
| WO | WO 2006/036505 A1 | 4/2006 |
| WO | WO 2007/088767 A1 | 8/2007 |
| WO | 2010/027890 A2 | 3/2010 |
| WO | 2010/027890 A3 | 5/2010 |

OTHER PUBLICATIONS

Tummala, Rao R. et al., Fundamentals of Microsystems Packaging, sections 1.3.4 & 1.3.5, McGraw-Hill, 2001, 7 pages.

International Preliminary Report on Patentability received for PCT Patent Application No. PCT/US2009/055133, dated Mar. 17, 2011, 5 pages.

R. Arnold, "Chip Scale Package Versus Direct Chip Attach (CSP vs DCA)", 2000 Electronic Components and Technology Conference, pp. 822-828.

International Preliminary Report on Patentability for PCT/US2009/055133 dated Mar. 8, 2011, 4 pages.

First Office Action for Chinese Patent Application 200980135013.7 dated Jul. 4, 2012 and English Translation thereof.

Office Communication from the German Patent and Trademark Office for German Patent Application No. 11 2009 002 155.7 dated Feb. 26, 2014 and English summary thereof.

Decision of Rejection for Japanese Patent Application No. 2011-526113 dated Jun. 19, 2012 and English Summary thereof.

Decision of Rejection for Japanese Patent Application No. 2011-526113 dated May 21, 2013 and English Summary thereof.

Notice of Reasons for Rejection for Japanese Patent Application No. 2013-195262 dated Oct. 28, 2014 and English Summary thereof.

Notice of Reasons for Rejection (2nd Non Final) for Japanese Patent Application No. 2013-195262 dated Sep. 1, 2015 and English Summary thereof.

Notice of Preliminary Rejection from the Korean Intellectual Property Office for Korean Patent Application No. 10-2011-7005490 dated Feb. 29, 2012 and English Translation thereof.

Notice of Final Rejection from the Korean Intellectual Property Office for Korean Patent Application No. 10-2011-7005490 dated Sep. 28, 2012 and English Translation thereof.

Notice of Second Final Rejection from the Korean Intellectual Property Office for Korean Patent Application No. 10-2011-7005490 dated Jan. 30, 2013 and English Translation thereof.

Appeal Decision from the Korean Intellectual Property Office for Korean Patent Application No. 10-2011-7005490 dated Apr. 29, 2014 and English Translation thereof.

Notice of Preliminary Rejection from the Korean Intellectual Property Office for Korean Patent Application No. 10-2013-7011381 dated Aug. 21, 2015.

Notice of Final Rejection from the Korean Intellectual Property Office for Korean Patent Application No. 10-2013-7011381 dated Mar. 19, 2015 and English Translation thereof.

(56) References Cited

OTHER PUBLICATIONS

Notice of Final Rejection from the Korean Intellectual Property Office dated Mar. 31, 2015, Korean Patent Application No. 10-2013-7011381 and English Translation thereof.

Notice of Second Final Rejection from the Korean Intellectual Property Office for Korean Patent Application No. 10-2013-7011381 dated Jul. 17, 2015 and English Translation thereof.

Notice of Non-Final Reasons for Rejection from the Japanese Patent Office dated Jun. 19, 2012 for Japanese Patent Application No. 2011-526113 and English Summary thereof.

Decision of Rejection from the Japanese Patent Office dated May 10, 2016 for Japanese Patent Application No. 2013-195262 and English Translation thereof.

Office Action from the Japanese Patent Office dated Dec. 26, 2016 for Japanese Patent Application No. 2013-195262 and English Translation thereof.

Notice of Reasons for Rejection from the Japan Patent Office for Japanese Patent Application No. 2013-195262 (1 page) and English Translation (1 page) thereof.

* cited by examiner

US 10,251,273 B2

MAINBOARD ASSEMBLY INCLUDING A PACKAGE OVERLYING A DIE DIRECTLY ATTACHED TO THE MAINBOARD

FIELD OF THE INVENTION

The disclosed embodiments relate generally to computing systems, and more particularly to a system-level board assembly.

BACKGROUND OF THE INVENTION

A hand-held computing device—such as, for example, a cell phone, a smart phone, a mobile internet device, etc.—typically includes several components disposed on a system-level circuit board. The aforementioned components may include integrated circuit (IC) devices, passive electrical components, and various input/output (I/O) devices, as well as any combination of these and/or other components. Many of these components—although perhaps not all—may be assembled onto the system-level board, which may be referred to as a mainboard. The mainboard provides electrical paths to interconnect these various components to form a computing system.

For hand-held computing devices, a system-level board assembly having a small form factor may be desirable. One solution to achieve a small form factor is to use a package-on-package (PoP) architecture, which generally includes an upper IC package stacked over and electrically coupled with a lower IC package, each package including one or more IC die disposed on a substrate or other die carrier. However, a PoP component may increase the overall height (or thickness) of the assembly. Further, the relatively lower layer count commonly found in the lower substrate of a PoP component (e.g., 2-4 layers, as compared to the mainboard, which may have 6 or more layers) can limit routing flexibility between the upper and lower packages. Conversely, to mount these two packages side-by-side on the mainboard will increase the surface area of the assembly.

DETAILED DESCRIPTION OF THE INVENTION

Disclosed are embodiments of a system-level assembly including an integrated circuit (IC) die directly attached to a mainboard and a package overlying at least a portion of the IC die. An IC die directly coupled with a mainboard or other circuit board may be referred to as a direct-chip attach (DCA) die. The package is also attached to the mainboard, and this package my include one or more other IC die disposed on a substrate or other die carrier. The mainboard provides electrical communication between the DCA die and the overlying package, as well as electrical communication between the DCA die and one or more other components disposed on the mainboard. The mainboard may also provide electrical communication between the package and one or more of the other components disposed on the mainboard. By way of example, the DCA die may include a processing system, and the package may include one or more memory devices. Also disclosed are embodiments of a method of making the aforementioned mainboard assembly.

Figure 1A:
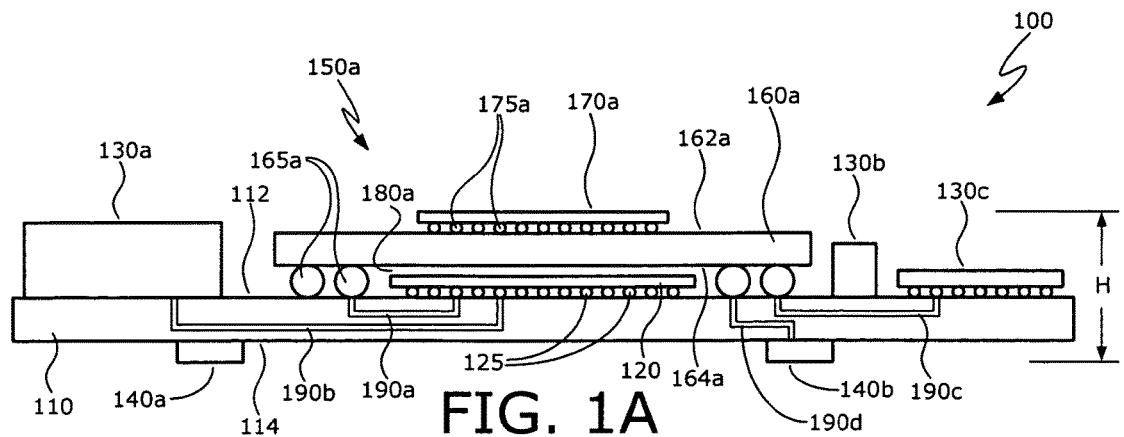
FIG. 1A is a schematic diagram illustrating an elevation view of an embodiment of an assembly including a mainboard having a package overlying an IC die directly attached to the mainboard.

Turning now to FIG. 1A, illustrated is an embodiment of an assembly 100. The assembly 100 includes a number of components disposed on a mainboard 110. Mainboard 110 includes a first side 112 and an opposing second side 114, and various components may be disposed on either one or both of the first and second sides 112, 114. The mainboard also includes a number of electrical paths (e.g., conductive traces, conductive vias, plated thru-holes, etc.) which interconnect one or more of the components disposed on the mainboard 110 to form a computing system. The mainboard assembly 100 may comprise any type of computing system, such as a hand-held computing device (e.g., a cell phone, a smart phone, a mobile internet device, etc.) or a mobile computing device (e.g., a lap-top, a net-top computer, etc.). However, the disclosed embodiments are not limited to hand-held and other mobile computing devices, and these embodiments may find application in other types of computing systems, such as desk-top computers and servers.

Mainboard 110 may comprise any suitable type of circuit board or other substrate capable of providing electrical communication between one or more of the various components disposed on the board. In one embodiment, for example, the mainboard 110 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 110. However, it should be understood that the disclosed embodiments are not limited to the above-described PCB and, further, that mainboard 110 may comprise any other suitable substrate.

Disposed directly on the first side 112 of mainboard 110 is an IC die 120. The IC die 120 may comprise any type of integrated circuit device. In one embodiment, the IC die 120 includes a processing system (either single core or multi-core). For example, the IC die may comprise a microprocessor, a graphic processor, a signal processor, a network processor, a chipset, etc. However, it should be understood that the disclosed embodiments are not limited to any particular type or class of IC devices.

The IC die 120 is electrically coupled to the mainboard 110 by a number of interconnects 125. Interconnects 125 may comprise any type of structure and materials capable of providing electrical communication between the die 120 and mainboard 110. In addition, the interconnects 125 may directly attach the IC die 120 to the mainboard 110, either alone or in conjunction with other structures or features that couple the die and board. In one embodiment, the interconnects 125 electrically coupled the die 120 to board 110 and also aid in mechanically securing the die to the mainboard. However, in other embodiments, the interconnects 125 may provide a minimal contribution to the mechanical attachment of die 120 to mainboard 110. In a further embodiment, a layer of underfill material may also aid in mechanically securing the die 120 to mainboard 110, as will be described below. As previously noted, an IC die directly coupled to a circuit board in the aforementioned configuration may be referred to as a direct-chip attach (DCA) die.

As noted above, the interconnects 125 may comprise any suitable type of interconnect and may comprise any suitable electrically conductive materials. According to one embodiment, the interconnects 125 comprise an array of solder bumps extending between the die 120 and mainboard 110 (perhaps in combination with an array of copper columns and/or copper pads disposed on the die 120 and/or board 110), and a solder reflow process may be utilized to form the interconnects 125. Of course, it should be understood that many other types of interconnects and materials are possible (e.g., wirebonds extending between the die 120 and mainboard 110).

Also disposed on the mainboard 110 is a package 150a. Package 150a overlies at least a portion of the DCA die 120. In one embodiment, the periphery of DCA die 120 lies entirely within a periphery of the package 150a, and in a further embodiment DCA die 120 and package 150a are oriented concentric to one another (as shown in FIG. 1A). The package 150a includes a substrate 160a having a first side 162a and an opposing second side 164a. In addition, the package 150a includes at least one IC die 170a disposed on the substrate's first side 162a (or perhaps the opposing second die 162b, as will be described below). Also, it should be noted that, in some embodiments, other components may be disposed on the package 150a. Other components that may be disposed on package 150a include, for example, a voltage regulator and passive electrical devices, such as capacitors, filters, inductors, etc.

The IC die 170a may comprise any type of integrated circuit device. According to one embodiment, the IC die 170a comprises a memory. For example, the IC die 170a may comprise any type of dynamic random access memory (DRAM), any type of static random access memory (SRAM), or any type of flash memory. In yet another embodiment, the package 150a may comprise a solid state drive (SSD), which may have several IC die including a memory controller and one or more memory die (although in other embodiments the package 150a may not include a memory controller). As the reader will appreciate, however, IC die 170a may comprise any other type or class of IC device.

The IC die 170a is electrically coupled to the substrate 160a by a number of interconnects 175a. The interconnects 175a provide electrical connections between the die 170a and substrate 160a, and these interconnects may also aid in mechanically securing the die to this substrate. To aid in securing the die 170a to substrate 160a, a layer of underfill (not shown in figures) may be disposed between the die 170a and substrate 160a. The interconnects 175a may comprise any suitable type of interconnect and may comprise any suitable electrically conductive materials. According to one embodiment, the interconnects 175a comprise an array of solder bumps extending between the die 170a and the substrate 160a (perhaps in combination with an array of copper columns and/or copper pads disposed on the die 170a and/or substrate 160a), and a solder reflow process may be utilized to form the interconnects 175a. Of course, it should be understood that many other types of interconnects and materials are possible (e.g., wirebonds extending between the die 170a and substrate 160a).

Substrate 160a—sometimes referred to as a "package substrate"—may comprise any suitable type of substrate capable of providing electrical communications between the IC die 170a and the underlying mainboard 110. The substrate 160a may also provide structural support for the die 170a. By way of example, in one embodiment, substrate 160a comprises a multi-layer substrate—including alternating layers of a dielectric material and metal—built-up around a core layer (either a dielectric or metal core). In another embodiment, the substrate 160a comprises a coreless multi-layer substrate. Other types of substrates and substrate materials may also find use with the disclosed embodiments (e.g., ceramics, sapphire, glass, etc.). Further, according to one embodiment, the substrate 160a may comprise alternating layers of dielectric material and metal that are built-up around the die 170a itself, this process sometimes referred to as a "bumpless build-up process." Where such an approach is utilized, the interconnects 175a may not be needed (as the build-up layers may be disposed directly over the die 170a).

The substrate 160a—and hence package 150a—is electrically coupled to the mainboard 110 by a number of interconnects 165a. The interconnects 165a provide electrical connections between the package 150a and mainboard 110, and these interconnects may also aid in mechanically securing the package 150a to this board. In another embodiment, as will be described below, a layer of underfill material may assist in mechanically securing the package 150a to the mainboard 110. The interconnects 165a may comprise any suitable type of interconnect and may comprise any suitable electrically conductive materials. According to one embodiment, the interconnects 165a comprise an array of solder bumps extending between the substrate 160a and the mainboard 110 (perhaps in combination with an array of copper columns and/or copper pads disposed on the substrate 160a and/or board 110), and a solder reflow process may be utilized to form the interconnects 165a. In one embodiment, the height of reflowed interconnects 165a is such that a gap 180a exists between the DCA die 120 and the lower surface 164a of package 150a. According to other embodiments, the height of reflowed interconnects 165a is such that at least portions of the die 120 contact the lower surface 164a.

In addition to DCA die 120 and package 150a, one or more additional components may be disposed on either one or both sides 112, 114 of the mainboard 110. By way of example, as shown in the figures, components 130a, 130b, 130c may be disposed on the first side 112 of the mainboard 110, and components 140a, 140b may be disposed on the mainboard's opposing side 114. A number of electrical terminals (not shown in figures), such as, for example, metal pads or lands, may be disposed on the first and second sides 112, 114 of the mainboard to form electrical connections with these additional components. Additional components that may be disposed on the mainboard 110 include other IC devices (e.g., processing devices, memory devices, signal processing devices, wireless communication devices, etc.), power delivery components (e.g., a voltage regulator, a power supply such as a battery, and/or passive devices such as a capacitor), and one or more I/O devices (e.g., an antenna, a microphone, a keypad or other data entry device such as a touch screen display, and/or a graphics display, etc.), as well as any combination of these and/or other devices.

As noted above, the mainboard 110 provides electrical pathways interconnecting the components 120, 130a-c, 140a-b, 150a disposed on this board to form a computing system. In one embodiment, the mainboard 110 provides at least one electrical path electrically coupling the DCA die 120 with the package 150a. In another embodiment, the mainboard 110 provides at least one electrical path electrically coupling the DCA die 120 with another component disposed on the mainboard (e.g., any one of components 130a-c, 140a-b). In a further embodiment, the mainboard 110 provides at least one electrical path electrically coupling the package 150a with another of the components disposed on the mainboard. For example, the mainboard 110 may include an electrical path 190a coupling the DCA die 120 and package 150a, an electrical path 190b coupling the DCA die 120 to component 130a, an electrical path 190c coupling package 150a to component 130c, and an electrical path 190d coupling IC package 150a to component 140b disposed on the mainboard's opposing side 114. The electrical paths 190a-d may comprise any suitable conductive structures (e.g., any combination of traces, vias, plated thru-holes, etc.) fabricated from any suitable conductive material (e.g., copper). The illustrated electrical paths 190a-d are presented as examples to aid in understanding the disclosed embodiments; however, it should be understood that, in practice, the mainboard may include several additional electrical paths (perhaps hundreds or even thousands of these paths) to interconnect one or more of the various components disposed on the mainboard.

In another embodiment, a radiation shield (not shown in figures) may be disposed on the mainboard 110 and extend over the DCA die 120 and package 150a (or 150b or 150c). The DCA die 120 and/or package 150a may generate electromagnetic radiation, and the radiation shield may suppress the escape of this electromagnetic radiation in order to prevent electromagnetic interference with sensitive electrical components in proximity to the die 120 and package 150a. The radiation shield may comprise any suitable electrically conductive material (e.g., electrically conductive metals, such as nickel, silver, aluminum, copper, and alloys of these and/or other metals), and this shield may have any suitable shape and configuration. In one embodiment, the radiation shield is electrically coupled and grounded to the mainboard 110. Also, in other embodiments, the radiation shield may also assist in removing heat from the package 150a and/or DCA die 120. In another embodiment, other thermal solutions may be disposed on the mainboard 110 (e.g., a heat spreader, a heat sink, etc.), either alone or in combination with a radiation shield.

It should be emphasized that the disclosed embodiments are not limited to the configuration shown in FIG. 1A and, further, that other types of packages may be disposed over the DCA die 120. Additional embodiments are illustrated in each of FIGS. 1B and 1C, which are described below. Reference numerals used to identify certain features of the assembly 100 shown in FIG. 1A are retained in each of FIGS. 1B and 1C for like elements of these assemblies. Further, descriptions of like elements previously described in the discussion of FIG. 1A may not be repeated in the text below.

Figure 1B:
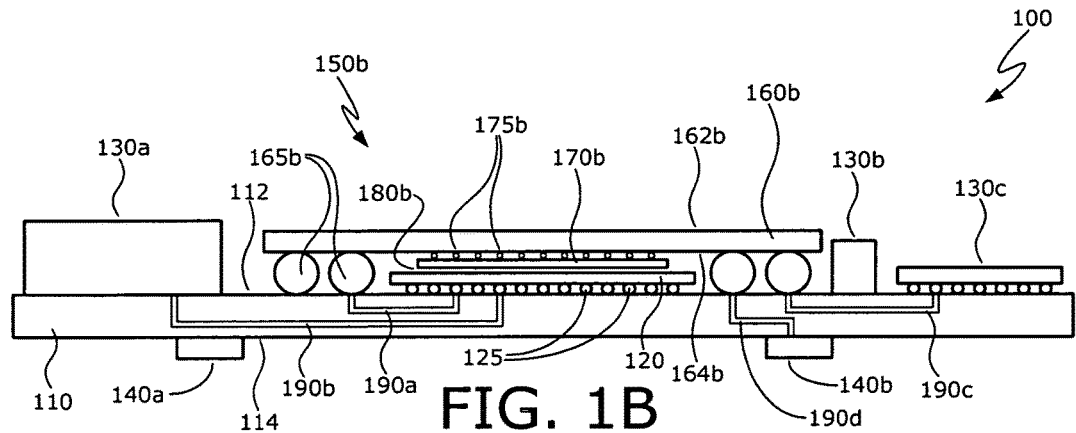
FIG. 1B is a schematic diagram illustrating an elevation view of another embodiment of an assembly including a mainboard having a package overlying an IC die directly attached to the mainboard.

Referring first to FIG. 1B, illustrated is another embodiment of the assembly 100. The embodiment of FIG. 1B is similar to that of FIG. 1A, but the assembly of FIG. 1B includes a package 150b disposed in a die-down configuration. More specifically, the package 150b comprises a substrate 160b having a first side 162b and an opposing second side 164b. The package 150b is electrically coupled to the mainboard by a number of interconnects 165b. An IC die 170b is disposed on the substrate's second side 164b and electrically coupled to the substrate 160b by a number of interconnects 165b. The IC die 170b faces the DCA die 120. In one embodiment, a gap 180b exists between the IC die 170b and DCA die 120, although in other embodiments portions of the IC die 170b may contact the underlying DCA die 120. Also, in a further embodiment, as will be described below, a layer of underfill (not shown in FIG. 1B) may be disposed between the substrate 160b and mainboard 110, and this underfill layer may also be present in the space between the DCA die 120 and mainboard 110, the gap 180b between the die 170b and die 120, and/or the space between the die 170b and substrate 160b. Also, in yet another embodiment, in addition to IC die 170b, one or more additional IC die may be disposed on the opposing side 162b of substrate 160b.

Figure 1C:
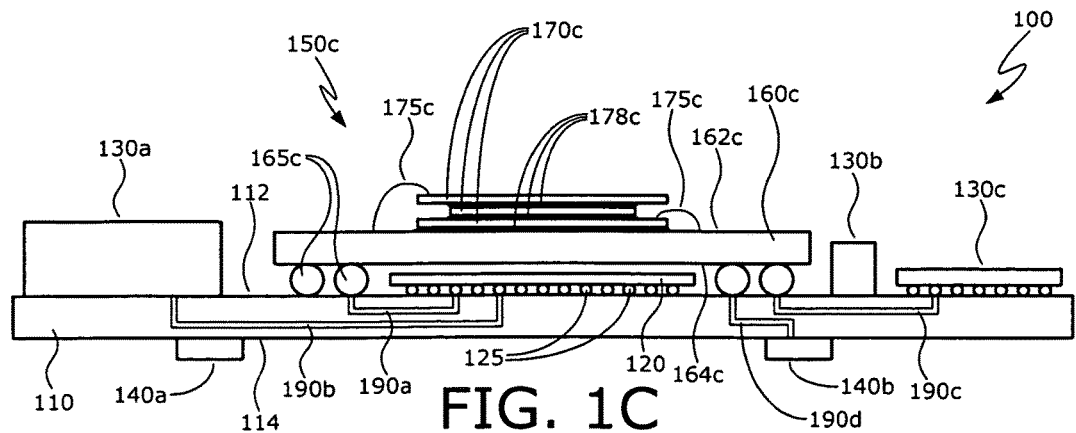
FIG. 1C is a schematic diagram illustrating an elevation view of a further embodiment of an assembly including a mainboard having a package overlying an IC die directly attached to the mainboard.

Referring next to FIG. 1C, illustrated is a further embodiment of the assembly 100. The embodiment of FIG. 1C is similar to that of FIG. 1A, but the assembly of FIG. 1C includes a package 150c having a die stack disposed thereon. More specifically, the package 150c comprises a substrate 160c having a first side 162c and an opposing second side 164c. The package 150c is electrically coupled to the mainboard 110 by a number of interconnects 165c. A number of die 170c arranged in a stacked configuration are disposed on the substrate 160c. The die 170c may be attached to substrate 160c and to one another by adhesive layers 178c. In another embodiment, a spacer may be disposed between any two adjacent die 170c. A number of interconnects 175c—in this example, wirebonds—may electrically couple each of the die 170c to substrate 160c and/or to one another. In one embodiment, all of the die 170c comprise the same type of integrated circuit, whereas in other embodiments, any one of the die 170c may be different from another of the die. In one embodiment, each of the IC die 170c comprises a memory device. In another embodiment, at least one of the die 170c comprises a memory controller and the other of die 170c in the stack comprise memory devices. In one embodiment, the package 150c comprises a solid state drive (SSD). According to one embodiment, a gap 180c exists between the substrate 160c and DCA die 120, although in other embodiments portions of the die 120 may contact the overlying substrate 160c. Also, in a further embodiment, as will be described below, a layer of underfill (not shown in FIG. 1C) may be disposed between the substrate 160c and mainboard 110, and this underfill layer may also be present in the space between the DCA die 120 and mainboard 110 and/or the gap 180c between the DCA die 120 and substrate 160c.

Figure 2:
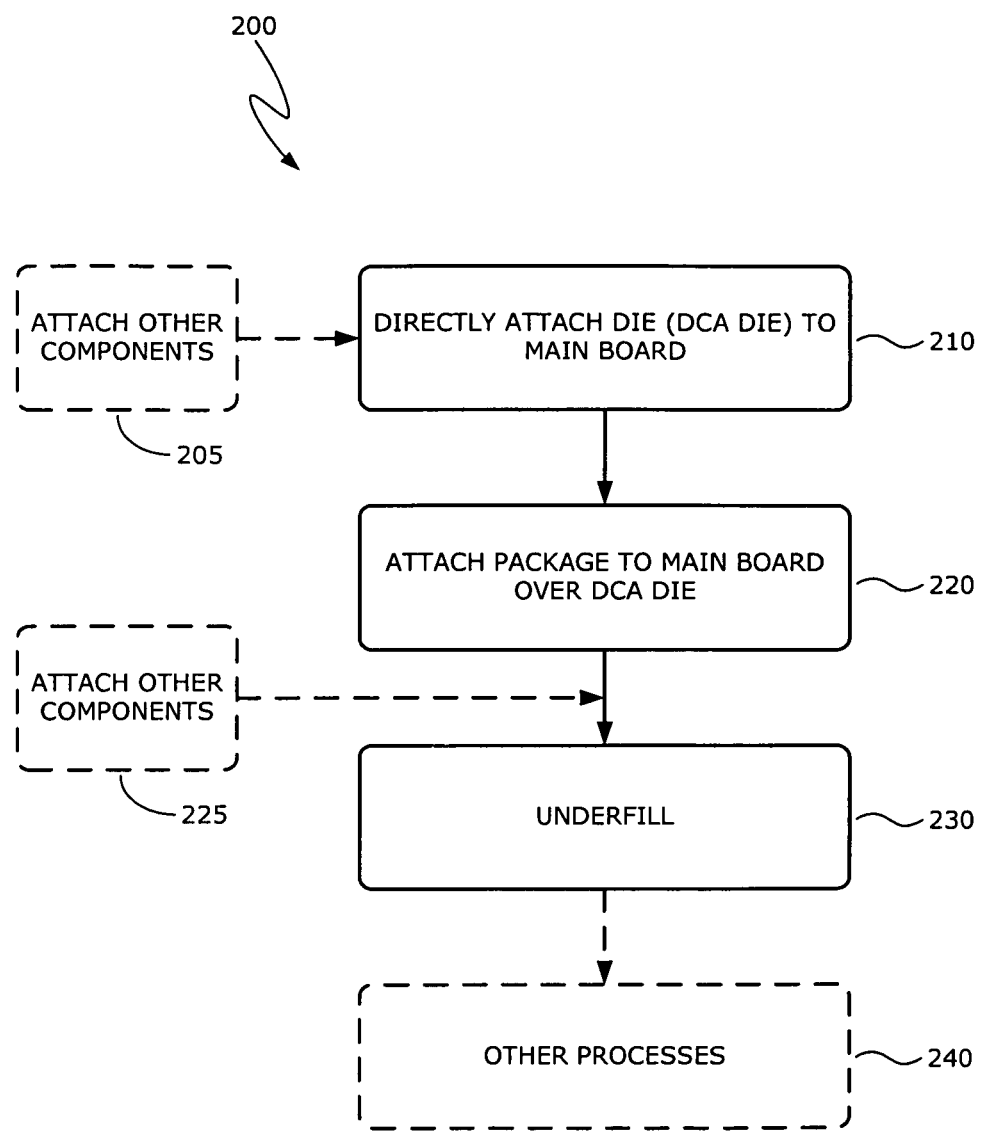
FIG. 2 is a block diagram illustrating an embodiment of a method of making a mainboard assembly including a mainboard having a package overlying an IC die directly attached to the mainboard.

Turning now to FIG. 2, illustrated are embodiments of a method of making a mainboard assembly, such as, for example, any of the embodiments of the assembly 100 shown in FIGS. 1A-1C. Various embodiments of the method of FIG. 2 are further illustrated in FIGS. 3A through 3E, and reference should be made to these figures as called out in the text below. Also, it should be noted that reference numerals used to identify certain features of the assembly 100 shown in FIG. 1A are retained in each of FIGS. 3A-3E for like elements, and descriptions of these like elements may not be repeated in the text below.

Figure 3A:
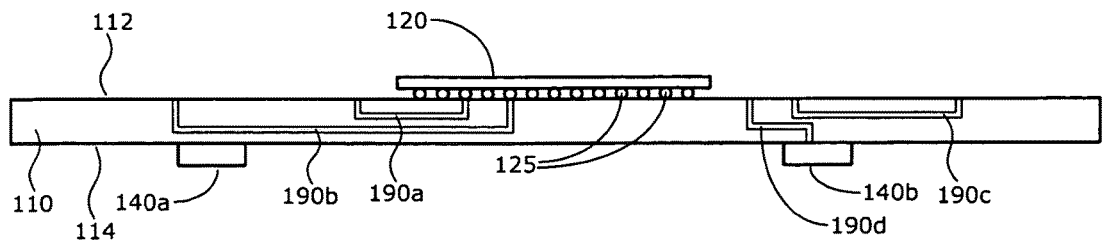
FIGS. 3A-3E are schematic diagrams illustrating embodiments of the method of making a mainboard assembly shown in FIG. 2.

Referring first to block 210 in FIG. 2, a die is directly attached to a mainboard. This is illustrated in FIG. 3A, where IC die 120 has been directly attached to mainboard 110 by a number of interconnects 125. A reflow operation may be performed to create interconnects 125 between the DCA die 120 and the mainboard 110. According to other embodiments, however, a reflow operation may not be performed immediately following placement of the die 120 on mainboard 110. In another embodiment, as set forth in block 205 and as shown in FIG. 3A, one or more other components may be secured to the mainboard 110 (e.g., components 140*a*, 140*b* disposed on the mainboard's opposing side 114) prior to attachment of the DCA die 120. However, in other embodiments, no components are attached to the mainboard prior to DCA die 120.

Figure 3B:
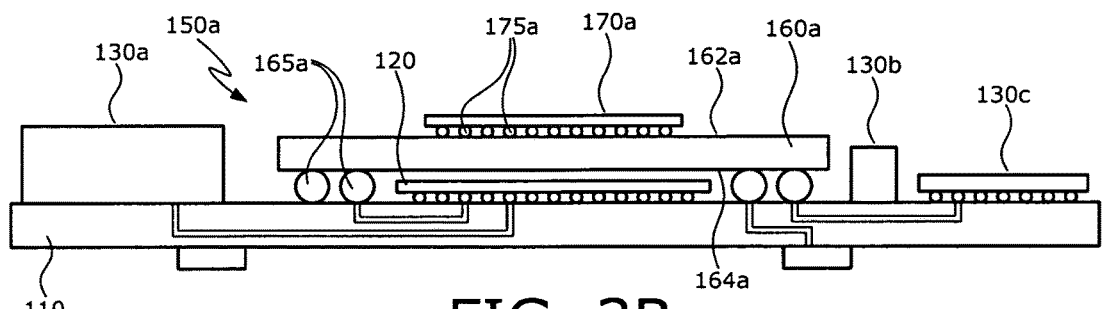
Figure 3C:
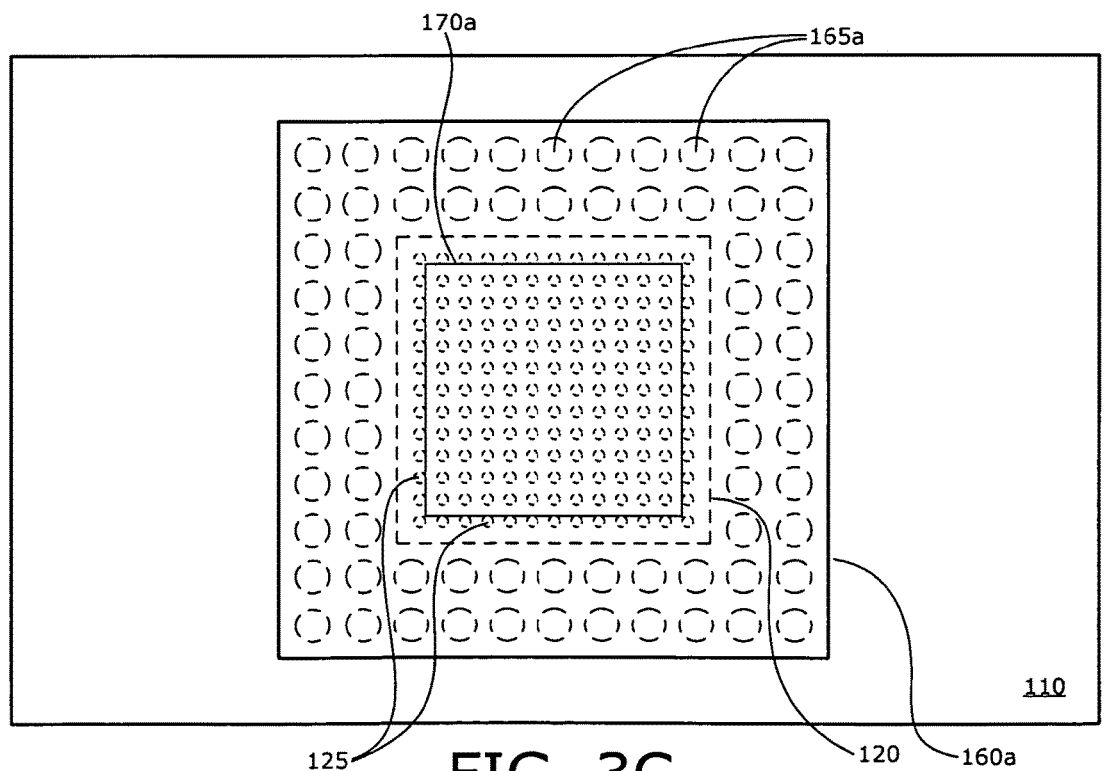

As set forth in block 220, a package is attached to the mainboard, and this package is disposed over at least part of the previously attached DCA die. This is illustrated in FIGS. 3B and 3C, where package 150*a* has been disposed over DCA die 120 and coupled with the mainboard by interconnects 165*a*. A side-elevation view is shown in FIG. 3B, whereas a plan view is shown in FIG. 3C. As best seen in FIG. 3C, in the illustrated embodiment, the package 150*a* and DCA die 120 are generally concentric to one another, and die 120 and interconnects 125 lie within the pattern of interconnects 165*a*. In another embodiment, a set forth in block 225, additional components may be disposed on the mainboard 110 along with the package 150*a*. This is illustrated in FIG. 3B, where components 130*a*-130*c* have also been disposed on the mainboard 110 (for clarity and ease of illustration the components 130*a*-*c* have been omitted from FIG. 3C). In one embodiment, a reflow operation is performed to complete formation of interconnects 165*a* that extend between package 150*a* and mainboard 110 and to couple the components 130*a*-*c* to mainboard 110. In another embodiment, a single reflow operation may be performed to create interconnects 125 and interconnects 165*a*, and in yet another embodiment this single reflow operation may also attach components 130*a*-*c* to mainboard 110. However, in other embodiments, a reflow operation may be performed to create only interconnects 165*a* (and a prior reflow operation performed to create interconnects 125).

Figure 3D:
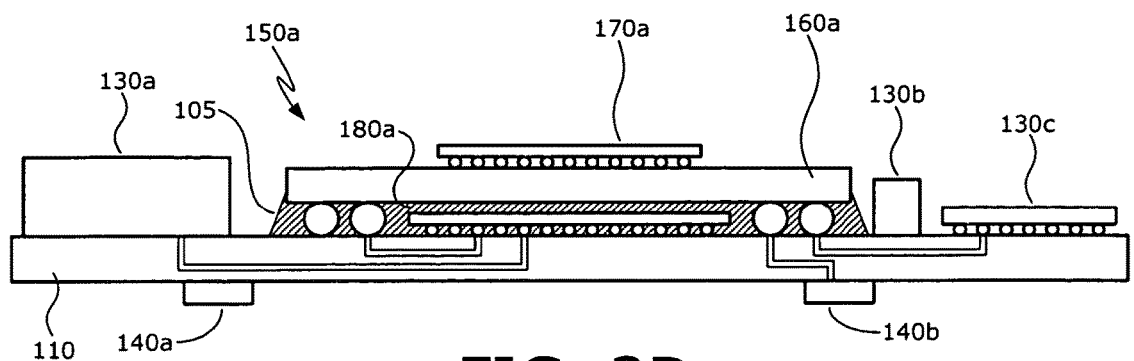
Figure 3E:
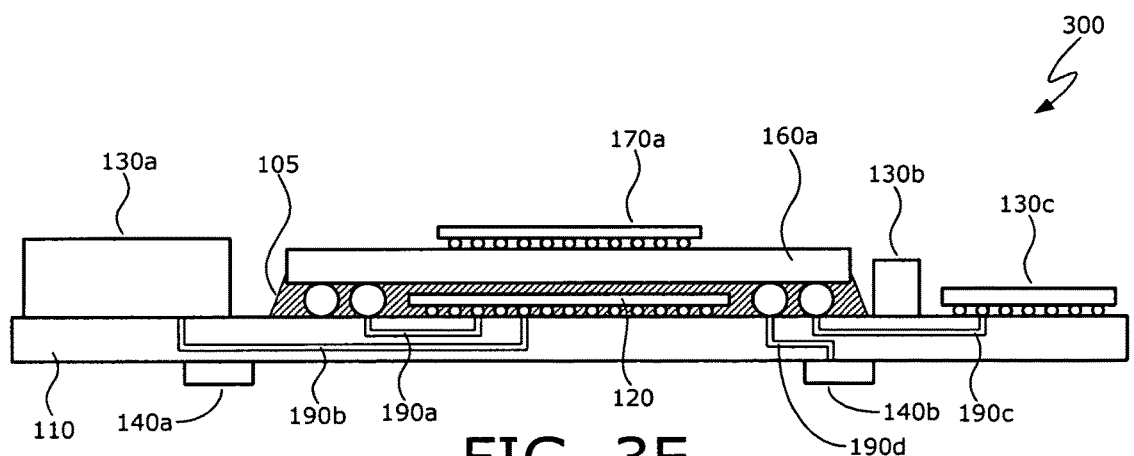

Referring to block 230, an underfill material may be disposed on the mainboard. This is illustrated in FIG. 3D, where material has been disposed between the package 150*a* and mainboard 110 to form an underfill layer 105, this underfill layer 105 also filling the space 180*a* between the DCA die 120 and substrate 160*a*, as well as the space between the DCA die 120 and mainboard 110. The underfill material 105 may comprise any suitable material, such as liquid or pre-applied epoxy compounds. Further, this underfill material may be applied using any suitable technique (e.g., capillary flow, jet dispense, a preformed sheet, etc.). In one embodiment, after application of the underfill layer 105, a heating process is performed to cure the underfill layer. In yet another embodiment, the underfill layer is cured during a reflow operation (e.g., the reflow operation to form interconnects 165*a*). In a further embodiment, underfill material may be applied in two steps. For example, an underfill layer may be applied under the DCA die 120 in one step, and an underfill layer may be applied under package 150*a* in a second step.

In another embodiment, as set forth in block 240, one or more additional processes may be performed after underfill (and/or after attachment of the package). For example, additional components (e.g., components 130*a*-*c* and/or components 140*a*-*b*) may be secured to and electrically coupled with the mainboard 110. Again, as noted above, one or more of these components may be secured to the mainboard at an earlier stage of assembly. According to one embodiment, electrical interconnects formed to couple any one or more of these additional components 130*a*-*c*, 140*a*-*b* are reflowed in the same reflow operation used to form the interconnects 125 and/or the interconnects 165*a*. Other additional processes that may be performed include mechanical attachment of components (e.g., attachment by rivets, clips, screws, and other fasteners, etc.), as well as testing.

The above-described embodiments may exhibit several noteworthy features. For example, the overall height or thickness H (see FIG. 1A) of the assembly 100 may be relatively small (e.g., the thickness H may be approximately 1.6 mm whereas the corresponding thickness of a standard PoP assembly may be approximately 2.7 mm). By way of further example, the mainboard 110 may have a relatively greater number of metal layers (e.g., 6 or more), which can provide increased routing flexibility between the DCA die 120 and package 150*a* (and/or other components disposed on the mainboard 110). Also, application of the disclosed embodiments should not result in any increase in the overall size or footprint of the mainboard assembly.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. An assembly comprising:
a mainboard having a first side and an opposing second side;
an integrated circuit die directly attached (DCA die) to the mainboard, the DCA die disposed on the first side of the mainboard and having a first space between the DCA die and the mainboard;
a package including an integrated circuit (IC) die and a package substrate, the IC die attached directly to the package substrate without an intervening substrate between the IC die and the package substrate, the package substrate attached directly to the mainboard by a plurality of interconnects, the package disposed on the first side of the mainboard and overlying at least a portion of the DCA die with a second space between the package and the DCA die; and
an underfill material layer filling the first space between the DCA die and the mainboard, filling the second space between the package and the DCA die, and surrounding the plurality of interconnects attaching the package to the mainboard;
wherein the mainboard includes at least one electrical path coupling the DCA die to the package and at least one other electrical path coupling the DCA die to an electrical terminal disposed on the mainboard, the electrical terminal to couple with another component.

2. The assembly of claim 1, wherein the IC die faces the DCA die.

3. The assembly of claim 1, wherein the DCA die comprises a processing system and the IC die comprises a memory.

4. The assembly of claim 1, wherein the DCA die comprises a processing system, the package includes at least one memory die, and the at least one other component comprises a wireless communications device.

5. The assembly of claim 4, further comprising:
a graphics display disposed on the mainboard, the mainboard including an electrical path coupling the graphics display to at least one of the DCA die and the package; and a power supply disposed on the mainboard, the mainboard electrically coupling the DCA die and the package to the power supply.

6. The assembly of claim 4, further comprising a data entry device disposed on the mainboard.

7. A computing system comprising:
a mainboard having a first side and an opposing side;
an integrated circuit die directly attached (DCA die) to the mainboard, the DCA die disposed on the first side of the mainboard and having a first space between the DCA die and the mainboard, the DCA die including a processing system;
a package including a package substrate, the package substrate attached directly to the mainboard by a plurality of interconnects, the package disposed on the first side of the mainboard and overlying at least a portion of the DCA die with a second space between the package and the DCA die, the package including a die stack attached directly to the package substrate without an intervening substrate between the die stack and the package substrate, the die stack having at least a first integrated circuit (IC) die overlying and attached to a second IC die; and
an underfill material layer filling the first space between the DCA die and the mainboard, filling the second space between the package and the DCA die, and surrounding the plurality of interconnects attaching the package to the mainboard;
wherein the mainboard includes at least one electrical path coupling the DCA die to the package and at least one other electrical path coupling the DCA die to another component disposed on the mainboard.

8. The computing system of claim 7, wherein said another component comprises a graphics display disposed on the mainboard.

9. The computing system of claim 8, wherein the graphics display comprises a touch screen for data entry.

10. The computing system of claim 7, wherein each of the first IC die and the second IC die comprises a memory.

11. The computing system of claim 10, wherein the package comprises a solid state drive (SSD).

12. The computing system of claim 11, wherein the SSD includes a memory controller disposed in the die stack.

* * * * *